United States Patent
Cozma et al.

(10) Patent No.: US 11,650,899 B1
(45) Date of Patent: May 16, 2023

(54) USER INTERFACE EXPERIENCE BY COMPRESSING METRICS AND ALLOWING CUSTOMIZATION OF METRICS COMPRESSION FOR DETAILED ANALYTICS

(71) Applicant: Lenovo Global Technology (United States) Inc., Morrisville, NC (US)

(72) Inventors: Alexandru Cozma, Bucharest (RO); Jeffery J. Van Heuklon, Rochester, MN (US); Ioana Voicu, Bucharest (RO)

(73) Assignee: Lenovo Global Technology (United States) Inc., Morrisville, NC (US)

( * ) Notice: Subject to any disclaimer, the term of this patent is extended or adjusted under 35 U.S.C. 154(b) by 8 days.

(21) Appl. No.: 17/581,716

(22) Filed: Jan. 21, 2022

(51) Int. Cl.
*G06F 16/2457* (2019.01)
*G06F 11/32* (2006.01)
*G06F 9/451* (2018.01)
*H03M 7/30* (2006.01)

(52) U.S. Cl.
CPC ............ *G06F 11/324* (2013.01); *G06F 9/451* (2018.02); *G06F 16/2457* (2019.01); *H03M 7/30* (2013.01)

(58) Field of Classification Search
CPC .... G06F 11/324; G06F 9/451; G06F 16/2457; H03M 7/30; H03M 7/00; H03M 7/3002
See application file for complete search history.

(56) References Cited

U.S. PATENT DOCUMENTS

| | | | | |
|---|---|---|---|---|
| 6,493,728 B1 * | 12/2002 | Berger | ................ | G06F 16/283 |
| 6,507,804 B1 * | 1/2003 | Hala | ..................... | G01N 29/14 |
| | | | | 702/56 |
| 10,827,039 B1 * | 11/2020 | Dandekar | ............... | H04L 69/04 |
| 2001/0003527 A1 * | 6/2001 | Shinohara | ............... | H03M 7/30 |
| | | | | 370/521 |
| 2001/0038715 A1 * | 11/2001 | Emoto | .................... | H03M 7/30 |
| | | | | 382/232 |
| 2010/0325132 A1 * | 12/2010 | Liu | .................... | G06F 16/24568 |
| | | | | 707/769 |
| 2013/0212142 A1 * | 8/2013 | Martinez Heras | ...... | G06F 17/17 |
| | | | | 708/290 |
| 2018/0365301 A1 * | 12/2018 | Poghosyan | ......... | G06F 16/2477 |
| 2020/0073958 A1 * | 3/2020 | Rupp | ..................... | G06F 7/483 |
| 2021/0359702 A1 * | 11/2021 | Hayzen | ............... | H03M 7/3068 |
| 2022/0318115 A1 * | 10/2022 | Cozma | .................... | G06F 11/32 |

* cited by examiner

*Primary Examiner* — Dino Kujundzic
(74) *Attorney, Agent, or Firm* — Kunzler Bean & Adamson; Bruce R. Needham

(57) ABSTRACT

A method includes identifying maximum and minimum values in an input data set after a request to display data from the data set, which is remote and includes many entries with a first and a second value. First values are ordered sequentially and maximum and minimum values are second values. The method subtracts the minimum value from the maximum value to find a height, determines a target data amount for downloading to display to satisfy interface quality experience criteria, and calculates a difference level for a compression algorithm. The compression algorithm uses the difference level to select input data set entries for a compressed data set and is based on the input data set, the target data amount and the height. The method includes processing the input data set with the compression algorithm and the difference level to create the compressed data set, and transmitting the compressed data set.

20 Claims, 8 Drawing Sheets

USER INTERFACE EXPERIENCE BY COMPRESSING METRICS AND ALLOWING CUSTOMIZATION OF METRICS COMPRESSION FOR DETAILED ANALYTICS

FIELD

The subject matter disclosed herein relates to displaying data and more particularly relates to an improved user interface experience by compressing metrics and allowing customization of metrics compression for detailed analysis.

BACKGROUND

Often when a user wants to display metrics from a system monitoring application, there are too many metrics to download and display without taking a lot of time to download the metrics, which is very frustrating to a user. Typically, the metrics are located remotely from the information handling device used to display the metrics so the transmission rate over a computer network often becomes a bottleneck. The same is true for other applications accessing data located remotely from the information handling device that a user accesses to display the data.

BRIEF SUMMARY

A method for an improved user interface experience by using compression includes identifying a maximum value and a minimum value in an input data set in response to a request to display data from the input data set. The input data set is remote from a display location and the input data set includes a plurality of entries. Each entry includes a first value and a second value. The first values are ordered sequentially and the maximum value and the minimum value are second values. The method includes calculating a difference between the minimum value and the maximum value, where the difference is a height, determining a target data amount to be downloaded to a user display interface to satisfy user interface quality experience criteria, and calculating a difference level for a compression algorithm. The difference level is used with the compression algorithm to select entries of the input data set to be stored in a compressed data set and is based on the input data set, the target data amount and the height. The method includes processing the input data set with the compression algorithm and the difference level to create the compressed data set, and transmitting the compressed data set for display.

An apparatus for an improved user interface experience by using compression includes a processor and a memory storing code. The code is executable by the controller to perform operations that include identifying a maximum value and a minimum value in an input data set in response to a request to display data from the input data set. The input data set is remote from a display location and the input data set includes a plurality of entries. Each entry has a first value and a second value where the first values are ordered sequentially and the maximum value and the minimum value are second values. The code further includes operations that include calculating a difference between the minimum value and the maximum value, where the difference is a height, determining a target data amount to be downloaded to a user display interface to satisfy user interface quality experience criteria, calculating a difference level for a compression algorithm, where the difference level is used with the compression algorithm to select entries of the input data set to be stored in a compressed data set and is based on the input data set, the target data amount and the height, processing the input data set with the compression algorithm and the difference level to create the compressed data set, and transmitting the compressed data set for display.

A program product for an improved user interface experience by using compression includes a non-volatile computer readable storage medium storing program code. The program code is configured to be executable by a processor to perform operations that include identifying a maximum value and a minimum value in an input data set in response to a request to display data from the input data set. The input data set is remote from a display location and the input data set has a plurality of entries. Each entry includes a first value and a second value. The first values are ordered sequentially and the maximum value and the minimum value are second values. The program code is configured to be executable by a processor to perform operations that include calculating a difference between the minimum value and the maximum value, where the difference is a height, determining a target data amount to be downloaded to a user display interface to satisfy user interface quality experience criteria, calculating a difference level for a compression algorithm, where the difference level is used with the compression algorithm to select entries of the input data set to be stored in a compressed data set and is based on the input data set, the target data amount and the height, processing the input data set with the compression algorithm and the difference level to create the compressed data set, and transmitting the compressed data set for display.

BRIEF DESCRIPTION OF THE DRAWINGS

A more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Figure 1:
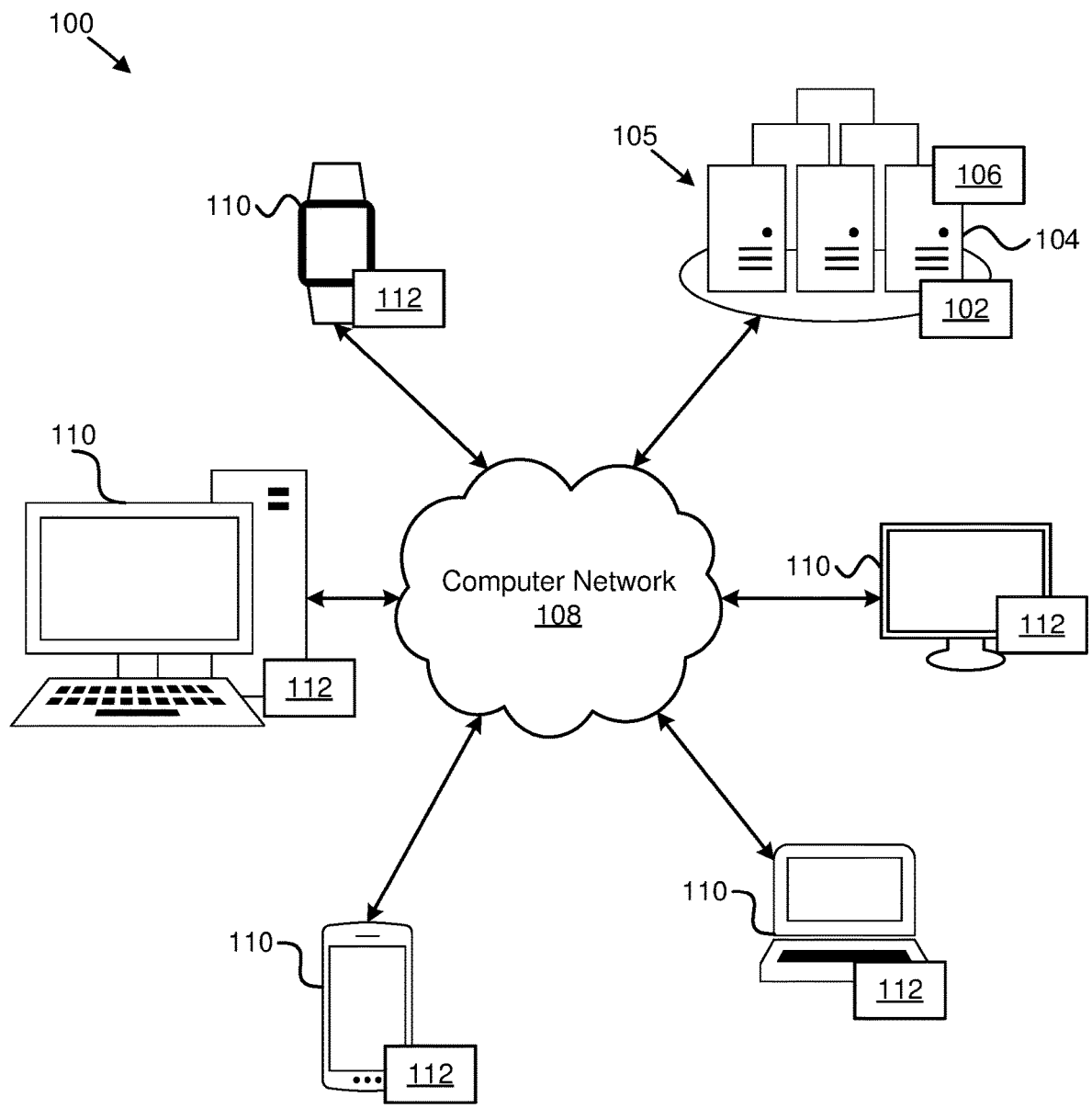
FIG. 1 is a schematic block diagram illustrating a system for an improved user interface experience by using compression, according to various embodiments.

As will be appreciated by one skilled in the art, aspects of the embodiments may be embodied as a system, method or program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a program product embodied in one or more computer readable storage devices storing machine readable code, computer readable code, and/or program code, referred hereafter as code. The storage devices may be tangible, non-transitory, and/or non-transmission. The storage devices may not embody signals. In certain embodiments, the storage devices only employ signals for accessing code.

Many of the functional units described in this specification have been labeled as modules, in order to more particularly emphasize their implementation independence. For example, a module may be implemented as a hardware circuit comprising custom very large scale integrated ("VLSI") circuits or gate arrays, off-the-shelf semiconductors such as logic chips, transistors, an application specific integrated circuit ("ASIC"), or other hardware circuits. A module may also be implemented in programmable hardware devices such as a field programmable gate array ("FPGA"), programmable array logic, programmable logic devices or the like.

Modules may also be implemented in code and/or software for execution by various types of processors. An identified module of code may, for instance, comprise one or more physical or logical blocks of executable code which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Indeed, a module of code may be a single instruction, or many instructions, and may even be distributed over several different code segments, among different programs, and across several memory devices. Similarly, operational data may be identified and illustrated herein within modules, and may be embodied in any suitable form and organized within any suitable type of data structure. The operational data may be collected as a single data set, or may be distributed over different locations including over different computer readable storage devices. Where a module or portions of a module are implemented in software, the software portions are stored on one or more computer readable storage devices.

Any combination of one or more computer readable medium may be utilized. The computer readable medium may be a computer readable storage medium. The computer readable storage medium may be a storage device storing the code. The storage device may be, for example, but not limited to, an electronic, magnetic, optical, electromagnetic, infrared, holographic, micromechanical, or semiconductor system, apparatus, or device, or any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

More specific examples (a non-exhaustive list) of the storage device would include the following: an electrical connection having one or more wires, a portable computer diskette, a hard disk, a random-access memory ("RAM"), a read-only memory ("ROM"), an erasable programmable read-only memory ("EPROM" or "Flash memory"), a portable compact disc read-only memory ("CD-ROM"), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Code for carrying out operations for embodiments may be written in any combination of one or more programming languages including an object oriented programming language such as Python, Ruby, R, Java, Java Script, Smalltalk, C++, C sharp, Lisp, Clojure, PHP, or the like, and conventional procedural programming languages, such as the "C" programming language, or the like, and/or machine languages such as assembly languages. The code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network ("LAN") or a wide area network ("WAN"), or the connection may be made to an external computer (for example, through the Internet using an Internet Service Provider).

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to," unless expressly specified otherwise. An enumerated listing of items does not imply that any or all of the items are mutually exclusive, unless expressly specified otherwise. The terms "a," "an," and "the" also refer to "one or more" unless expressly specified otherwise.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of various embodiments.

Aspects of the embodiments are described below with reference to schematic flowchart diagrams and/or schematic block diagrams of methods, apparatuses, systems, and program products according to embodiments. It will be understood that each block of the schematic flowchart diagrams and/or schematic block diagrams, and combinations of blocks in the schematic flowchart diagrams and/or schematic block diagrams, can be implemented by code. This code may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the schematic flowchart diagrams and/or schematic block diagrams block or blocks.

The code may also be stored in a storage device that can direct a computer, other programmable data processing apparatus, or other devices to function in a particular manner, such that the instructions stored in the storage device produce an article of manufacture including instructions which implement the function/act specified in the schematic flowchart diagrams and/or schematic block diagrams block or blocks.

The code may also be loaded onto a computer, other programmable data processing apparatus, or other devices to cause a series of operational steps to be performed on the computer, other programmable apparatus or other devices to produce a computer implemented process such that the code which execute on the computer or other programmable apparatus provide processes for implementing the functions/acts specified in the flowchart and/or block diagram block or blocks.

The schematic flowchart diagrams and/or schematic block diagrams in the Figures illustrate the architecture, functionality, and operation of possible implementations of apparatuses, systems, methods and program products according to various embodiments. In this regard, each block in the schematic flowchart diagrams and/or schematic block diagrams may represent a module, segment, or portion of code, which comprises one or more executable instructions of the code for implementing the specified logical function(s).

It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. Other steps and methods may be conceived that are equivalent in function, logic, or effect to one or more blocks, or portions thereof, of the illustrated Figures.

Although various arrow types and line types may be employed in the flowchart and/or block diagrams, they are understood not to limit the scope of the corresponding embodiments. Indeed, some arrows or other connectors may be used to indicate only the logical flow of the depicted embodiments. For instance, an arrow may indicate a waiting or monitoring period of unspecified duration between enumerated steps of the depicted embodiments. It will also be noted that each block of the block diagrams and/or flowchart diagrams, and combinations of blocks in the block diagrams and/or flowchart diagrams, can be implemented by special purpose hardware-based systems that perform the specified functions or acts, or combinations of special purpose hardware and code.

The description of elements in each figure may refer to elements of proceeding figures. Like numbers refer to like elements in all figures, including alternate embodiments of like elements.

As used herein, a list with a conjunction of "and/or" includes any single item in the list or a combination of items in the list. For example, a list of A, B and/or C includes only A, only B, only C, a combination of A and B, a combination of B and C, a combination of A and C or a combination of A, B and C. As used herein, a list using the terminology "one or more of" includes any single item in the list or a combination of items in the list. For example, one or more of A, B and C includes only A, only B, only C, a combination of A and B, a combination of B and C, a combination of A and C or a combination of A, B and C. As used herein, a list using the terminology "one of" includes one and only one of any single item in the list. For example, "one of A, B and C" includes only A, only B or only C and excludes combinations of A, B and C.

A method for an improved user interface experience by using compression includes identifying a maximum value and a minimum value in an input data set in response to a request to display data from the input data set. The input data set is remote from a display location and the input data set includes a plurality of entries. Each entry includes a first value and a second value. The first values are ordered sequentially and the maximum value and the minimum value are second values. The method includes calculating a difference between the minimum value and the maximum value, where the difference is a height, determining a target data amount to be downloaded to a user display interface to satisfy user interface quality experience criteria, and calculating a difference level for a compression algorithm. The difference level is used with the compression algorithm to select entries of the input data set to be stored in a compressed data set and is based on the input data set, the target data amount and the height. The method includes processing the input data set with the compression algorithm and the difference level to create the compressed data set, and transmitting the compressed data set for display.

In some embodiments, the compressed data set is for a default range of first values in the input data set and the method includes, in response to a request to display data from a subset of the input data set, identifying a maximum value and a minimum value of the subset, calculating a difference between the minimum value and the maximum value of the subset, where the difference is a height of the subset. In the embodiments, the method includes calculating a difference level for the subset, where the difference level is used with the compression algorithm to select entries to be stored in a compressed subset and is based on the subset, the target data amount and the height of the subset, processing the subset with the compression algorithm and the difference level of the subset to create the compressed subset, and transmitting the compressed subset for display. In further embodiments, the difference level for the subset is calculated as $\Delta_{zoom}=|\log_2(h_{sub})|*S_{def}*S_{sub}$ where $\Delta_{zoom}$ is the difference level for the subset, $h_{sub}$ is the height of the subset, $S_{def}$ is a compression scalar of the input data set and includes a scalar derived from the target data amount and a number of first values in the input data set, and $S_{sub}$ is a compression scalar of the subset and includes a scalar derived from the target data amount and a total number of first values in the subset. In other embodiments, the compression scalar of the subset includes a compression scalar for the input data set multiplied by a ratio of a number of first values of the subset divided by a number of first values of the input data set.

In some embodiments, the difference level for the input data set is calculated using a function of the height customized based on the target data amount and a number of first values in the input data set or using a compression scaler multiplied by a function of the height, where the compression scalar is for the input data set and includes a scalar derived from the target data amount and a number of first values in the input data set. In some embodiments, the difference level is calculated as $\Delta_{def}=|\log_2(h_{def})|*S_{def}$, where $\Delta_{def}$ is the difference level for the input data set, $h_{def}$ is the height of the input data set, and $S_{def}$ is a compression scalar of the input data set and includes a scalar derived from the target data amount and a number of first values in the input data set.

In some embodiments, the target data amount is based on the user interface quality experience criteria and a transmission rate. In other embodiments, the target data amount is adjusted based on the user interface quality experience criteria and a current transmission rate for transmitting data to the display location. In other embodiments, the compression algorithm finds a next entry to store in the compressed data set using $|C_{def}-P_{def}|>\Delta_{def}$, where $P_{def}$ is a most recent previously stored second value in the compressed data set, $\Delta_{def}$ is the difference level for the input data set, and $C_{def}$ is a second value being currently processed by the compression algorithm. In other embodiments, each first value is a point in time. In other embodiments, the user interface quality experience criteria includes a target time limit for displaying the compressed data set after the request to display data from the input data set. In other embodiments, the method includes, prior to transmitting the compressed data set, identifying a section of the compressed data set with a low amount of variation, increasing the difference level for the section of the compressed data set, reprocessing, using the compression algorithm, the section of the compressed data set using the increased difference level, replacing the section of the compressed data set with entries from reprocessing the section to produce a modified compressed data set, and transmitting the modified compressed data set for display.

An apparatus for an improved user interface experience by using compression includes a processor and a memory storing code. The code is executable by the controller to perform operations that include identifying a maximum value and a minimum value in an input data set in response to a request to display data from the input data set. The input data set is remote from a display location and the input data set includes a plurality of entries. Each entry has a first value and a second value where the first values are ordered sequentially and the maximum value and the minimum value are second values. The code further includes operations that include calculating a difference between the minimum value and the maximum value, where the difference is a height, determining a target data amount to be downloaded to a user display interface to satisfy user interface quality experience criteria, calculating a difference level for a compression algorithm, where the difference level is used with the compression algorithm to select entries of the input data set to be stored in a compressed data set and is based on the input data set, the target data amount and the height, processing the input data set with the compression algorithm and the difference level to create the compressed data set, and transmitting the compressed data set for display.

In some embodiments, the compressed data set is for a default range of first values in the input data set and the operations also include, in response to a request to display data from a subset of the input data set, identifying a maximum value and a minimum value of the subset, calculating a difference between the minimum value and the maximum value of the subset, where the difference is a height of the subset. In the embodiments, the operations include calculating a difference level for the subset, where the difference level is used with the compression algorithm to select entries to be stored in a compressed subset and is based on the subset, the target data amount and the height of the subset, processing the subset with the compression algorithm and the difference level of the subset to create the compressed subset, and transmitting the compressed subset for display. In other embodiments, the difference level for the subset is calculated as $\Delta_{zoom}=|\log_2(h_{sub})|*S_{sub}$, where $\Delta_{zoom}$ is the difference level for the subset, $h_{sub}$ is the height of the subset, and $S_{sub}$ is a compression scalar of the subset and includes a scalar derived from the target data amount and a total number of first values in the subset. The compression scalar of the subset includes a compression scalar for the input data set multiplied by a ratio of a number of first values of the subset divided by a number of first values of the input data set.

In some embodiments, the difference level for the subset is calculated as a compression scaler multiplied by a function of the height. The compression scalar is for the input data set and includes a scalar derived from the target data amount and a number of first values in the input data set. In other embodiments, the user interface quality experience criteria includes a target time limit for displaying the compressed data set after the request to display data from the input data set. In other embodiments, the target data amount is based on the user interface quality experience criteria and a transmission rate. In other embodiments, the target data amount is adjusted based on the user interface quality experience criteria and a current transmission rate for transmitting data to the display location. In other embodiments, the compression algorithm finds a next entry to store in the compressed data set using $|C_{def}-P_{def}|>\Delta_{def}$, where $P_{def}$ is a most recent previously stored second value in the compressed data set, $\Delta_{def}$ is the difference level for the input data set, and $C_{def}$ is a second value being currently processed by the compression algorithm.

A program product for an improved user interface experience by using compression includes a non-volatile computer readable storage medium storing program code. The program code is configured to be executable by a processor to perform operations that include identifying a maximum value and a minimum value in an input data set in response to a request to display data from the input data set. The input data set is remote from a display location and the input data set has a plurality of entries. Each entry includes a first value and a second value. The first values are ordered sequentially and the maximum value and the minimum value are second values. The program code is configured to be executable by a processor to perform operations that include calculating a difference between the minimum value and the maximum value, where the difference is a height, determining a target data amount to be downloaded to a user display interface to satisfy user interface quality experience criteria, calculating a difference level for a compression algorithm, where the difference level is used with the compression algorithm to select entries of the input data set to be stored in a compressed data set and is based on the input data set, the target data amount and the height, processing the input data set with the compression algorithm and the difference level to create the compressed data set, and transmitting the compressed data set for display.

In some embodiments, the compressed data set is for a default range of first values in the input data set and the code is further configured to perform operations that include, in response to a request to display data from a subset of the input data set, identifying a maximum value and a minimum value of the subset, subtracting the minimum value from the maximum value of the subset to calculate a height for the subset, calculating a difference level for the subset, where the difference level is used with the compression algorithm to select entries to be stored in a compressed subset and is based on the subset, the target data amount and the height of the subset, processing the subset with the compression algorithm and the difference level of the subset to create the compressed subset, and transmitting the compressed subset for display.

In some embodiments, the difference level for the input data set is calculated using a function of the height customized based on the target data amount and a number of first values in the input data set. In other embodiments, the difference level for the input data set is calculated using a compression scaler multiplied by a function of the height, where the compression scalar is for the input data set and includes a scalar derived from the target data amount and a number of first values in the input data set. In other embodiments, the compression algorithm finds a next entry to store in the compressed data set using $|C_{def}-P_{def}|>\Delta_{def}$, where $P_{def}$ is a most recent previously stored second value in the compressed data set, $\Delta_{def}$ is the difference level for the input data set, and $C_{def}$ is a second value being currently processed by the compression algorithm.

FIG. 1 is a schematic block diagram illustrating a system 100 for an improved user interface experience by using compression, according to various embodiments. In some embodiments, the system 100 includes a compression apparatus 102 in a server 104, which may be a server 104 in a datacenter 105. The server 104 and/or datacenter 105 includes an input data set 106. The server 104 is connected to a computer network 108 connected to one or more information handling devices 110, each with a display apparatus 112. In certain embodiments, even though a specific number of information handling devices 110, compression apparatuses 102, computer networks 106, datacenters 105, and servers 104 are depicted in FIG. 1, one of skill in the art will recognize, in light of this disclosure, that any number of information handling devices 110, compression apparatuses 102, computer networks 106, datacenters 105, and servers 104 may be included in the system 100.

In some embodiments, the system 100 includes one or more information handling devices 110 seeking to display a input data set 106. The information handling devices 110 may be embodied as one or more of a desktop computer, a server device, a laptop computer, a tablet computer, a smart phone, an Internet of Things device, a security system, a set-top box, a gaming console, a smart TV, a smart watch, a fitness band or other wearable activity tracking device, an optical head-mounted display (e.g., a virtual reality headset, smart glasses, head phones, or the like), a High-Definition Multimedia Interface ("HDMI") or other electronic display dongle, a personal digital assistant, a digital camera, a video camera, or another computing device with an electronic display where the information handling device 110 includes a processor (e.g., a central processing unit ("CPU"), a processor core, a field programmable gate array ("FPGA") or other programmable logic, an ASIC, a controller, a microcontroller, and/or another semiconductor integrated circuit device), a volatile memory, and/or a non-volatile storage medium, a display, a connection to a display, and/or the like.

Often an information handling device 110 seeks to display information that must be first downloaded over a computer network 108 from a remote location, such as from a server 104, which may be in a datacenter 105. Often, the information to be displayed is based on an input data set 106 that is large where downloading the entire input data set 106 would take a long time and a user may not want to wait for all of the input data to be downloaded. The compression apparatus 102 overcomes this dilemma using a compression routine to compress the input data set 106 so that an appropriate target data amount can be downloaded and displayed on an electronic display of the information handling device 110 in such a way that user interface quality experience criteria are met. Typically, the user interface quality experience criteria include an amount of time, such as three seconds, for the data to be displayed after a request to display the input data set 106. In addition, the compression apparatus 102 compresses the input data set 106 in such a way as to provide a reasonably accurate depiction of the input data set 106.

In general, the compression apparatus 102 is configured to receive a request to download data from the input data set 106 for display on an information handling device 110. In response, the compression apparatus 102 is configured to identify a maximum value and a minimum value of an input data set 106, determine a height from the difference between the maximum and minimum values, determine a target data amount to be downloaded to a user display interface to satisfy user interface quality experience data, calculate a difference level for a compression algorithm from the height, the input data set 106, and the target data amount, and processing the input data set 106 using the compression algorithm and difference level to create a compressed data set. The compression apparatus 102 then transmits the compressed data set to the information handling device 110 for display using a display apparatus 112. Typically, the display apparatus 112 displays the compressed data set fast enough to comply with the user interface quality experience criteria and the compressed data set reasonably represents the input data set 106. The compression apparatus 102 is described in more detail below with reference to FIGS. 2 and 3.

In certain embodiments, the compression apparatus 102 is implemented in code executable by a processor, such as a processor of the server 104. In the embodiments, the compression apparatus 102 is code stored on computer readable storage media, which is non-transitory. The computer readable storage media is accessible by the processor and all or portions of the code are read and/or copied to RAM and/or to the processor for execution. The input data set 106 is also stored on computer readable storage media accessible by a processor. In some embodiments one or both of the code of the compression apparatus 102 and the input data set 106 are stored in a storage device of a storage area network ("SAN") accessible to the server 104. In some embodiments, the code is executed on a virtual machine ("VM") running on a server 104 of the datacenter 105. In other embodiments, the compression apparatus 102 is implemented with a programmable hardware device, such as an FPGA and/or hardware circuits, such as an ASIC. One of skill in the art will recognize other ways to implement the compression apparatus 102.

In some embodiments, the input data set 106 includes sensor data gathered over time with a sensor reading paired with a time that the sensor was read. For example, the input data set 106 may include power readings and a time for each power reading. The power readings may be from one or more sensors and associated code or hardware to produce a power reading. The power reading may be for a processor, for the server 104 executing the compression apparatus 102, for another server 104 in the datacenter 105, for a power supply, for a group of computing equipment, etc. In other embodiments, the sensor reading may be a temperature sensor reading. In other embodiments, the input data includes a software parameter, such as processor utilization, memory utilization, network utilization, etc. In some embodiments, the input data set 106 includes multiple readings for each timestamp. For example, for each time stamp in the input data set 106 there are two or more sensor readings, software parameters, etc.

In some embodiments, the server 104 includes a system monitoring application that gathers data for the input data set 106. In some examples, the system monitoring application is a baseboard management controller ("BMC"). In other examples, the system monitoring application is a version of the Lenovo® XClarity™ Administrator, which is a centralized resource management solution monitoring various parameters within one or more servers 104. Where data for the input data set 106 is from a system monitoring application, the information handling device 110 includes a user interface for accessing and controlling the system monitoring application and includes a display apparatus 112 for displaying information from the system monitoring application.

In other embodiments, the input data set 106 includes data from another type of application on the server 104 running remotely from the information handling device 110. For example, the application may be a graphics application and the input data set 106 includes data from the graphics application. In some embodiments, the input data set 106 includes any data set located remotely from an information handling device 110 with data to be displayed at the information handling device 110 where the data set includes data that is compressible to reduce the amount of data to be downloaded.

In some embodiments, the input data set 106 includes data for a long period of time with enough points that downloading the entire input data set 106 would violate user interface quality experience criteria. For example, where the input data set 106 is from a system monitoring application, the input data set 106 may include data gathered for a long period of time, such as 24 hours, a week, etc. Downloading all of the input data set 106, in some embodiments, is inconvenient, impractical, and may not be needed where a user just wants to view basic trends over the long time interval of the input data set 106. The user may then want to zoom in on a particular time period, such as a one minute interval of a particular day, and would expect to see more detail. The compression apparatus 102 provides a compression algorithm capable of providing a good rendering of the entire input data set 106 in a reasonable amount of time, such as three seconds, without downloading the entire input data set 106. The compression apparatus 102 then allows the user to zoom in and the compression apparatus 102 modifies parameters for compression so that more detail is provided in a compressed data set transmitted to the information handling device 110 for display.

The display apparatus 112, in some embodiments, is an application running on a processor, a hardware device such as a graphics processing unit ("GPU"), a programmable hardware device, or some combination thereof that is capable of receiving a compressed data set and displaying data of the compressed data set on an electronic display. In some embodiments, a portion of the compression apparatus 102 runs on an information handling device 110 and interacts with the portion of the compression apparatus 102 running on the server 104. For example, the compression apparatus 102 running on the server 104 may interact with an application on the information handling device 110 customized to interact with the compression apparatus 102. In some embodiments, the display apparatus 112 is customized to interact with the compression apparatus 102 running on the server 104.

For example, the display apparatus 112 may be an application that is part of a system monitoring application and is customized to display data gathered by the system monitoring application. In some embodiments, the display apparatus 112 allows a user to display data of an input data set 106 gathered by the system monitoring application and, after the data is displayed, to zoom in and view a portion of the data in more detail. The compression apparatus 102 provides a mechanism to quickly display data on the display of the information handling device 110.

In other embodiments, all or a portion of the display apparatus 112 includes native functions, standard display functions, elements from a library, and the like. In some examples, the display apparatus 112 is a native display apparatus of the information handling device 110 and/or generic display application capable of displaying whatever data is sent by the compression apparatus 102 and allowing a user to issue commands to display data from the input data set and to zoom in to display a portion of the data of the input data set. In some embodiments, the display apparatus 112 works together with an application to display data from the compression apparatus 102.

The computer network 108, in some embodiments, includes a digital communication network that transmits digital communications. The computer network 108 may include a wireless network, such as a wireless cellular network, a local wireless network, such as a Wi-Fi network, a Bluetooth® network, a near-field communication ("NFC") network, an ad hoc network, and/or the like. The computer network 108 may include a wide area network ("WAN"), a storage area network ("SAN"), a local area network ("LAN") (e.g., a home network), an optical fiber network, the Internet, or other digital communication network. The computer network 108 may include two or more networks. The computer network 108 may include one or more servers, routers, switches, and/or other networking equipment. The computer network 108 may also include one or more computer readable storage media, such as a hard disk drive, an optical drive, non-volatile memory, RAM, or the like.

The wireless connection may be a mobile telephone network. The wireless connection may also employ a Wi-Fi network based on any one of the Institute of Electrical and Electronics Engineers ("IEEE") 802.11 standards. Alternatively, the wireless connection may be a Bluetooth® connection. In addition, the wireless connection may employ a Radio Frequency Identification ("RFID") communication including RFID standards established by the International Organization for Standardization ("ISO"), the International Electrotechnical Commission ("IEC"), the American Society for Testing and Materials® (ASTM®), the DASH7™ Alliance, and EPCGlobal™.

Alternatively, the wireless connection may employ a ZigBee® connection based on the IEEE 802 standard. In some embodiments, the wireless connection employs a Z-Wave® connection as designed by Sigma Designs®. Alternatively, the wireless connection may employ an ANT® and/or ANT-F® connection as defined by Dynastream® Innovations Inc. of Cochrane, Canada.

The wireless connection may be an infrared connection including connections conforming at least to the Infrared Physical Layer Specification ("IrPHY") as defined by the Infrared Data Association® ("IrDA"®). Alternatively, the wireless connection may be a cellular telephone network communication. All standards and/or connection types include the latest version and revision of the standard and/or connection type as of the filing date of this application.

The one or more servers 104, in some embodiments, may be embodied as blade servers, mainframe servers, tower servers, rack servers, and/or the like. The one or more servers 104 may be configured as mail servers, web servers, application servers, FTP servers, media servers, data servers, web servers, file servers, virtual servers, and/or the like. The one or more servers 104 may be communicatively coupled (e.g., networked) over a computer network 108 to one or more information handling devices 110 and may be configured to record, capture, store, or the like measurement data for various components of the server 104 and transmit the measurement data to other devices for processing, analysis, and/or the like.

Figure 2:
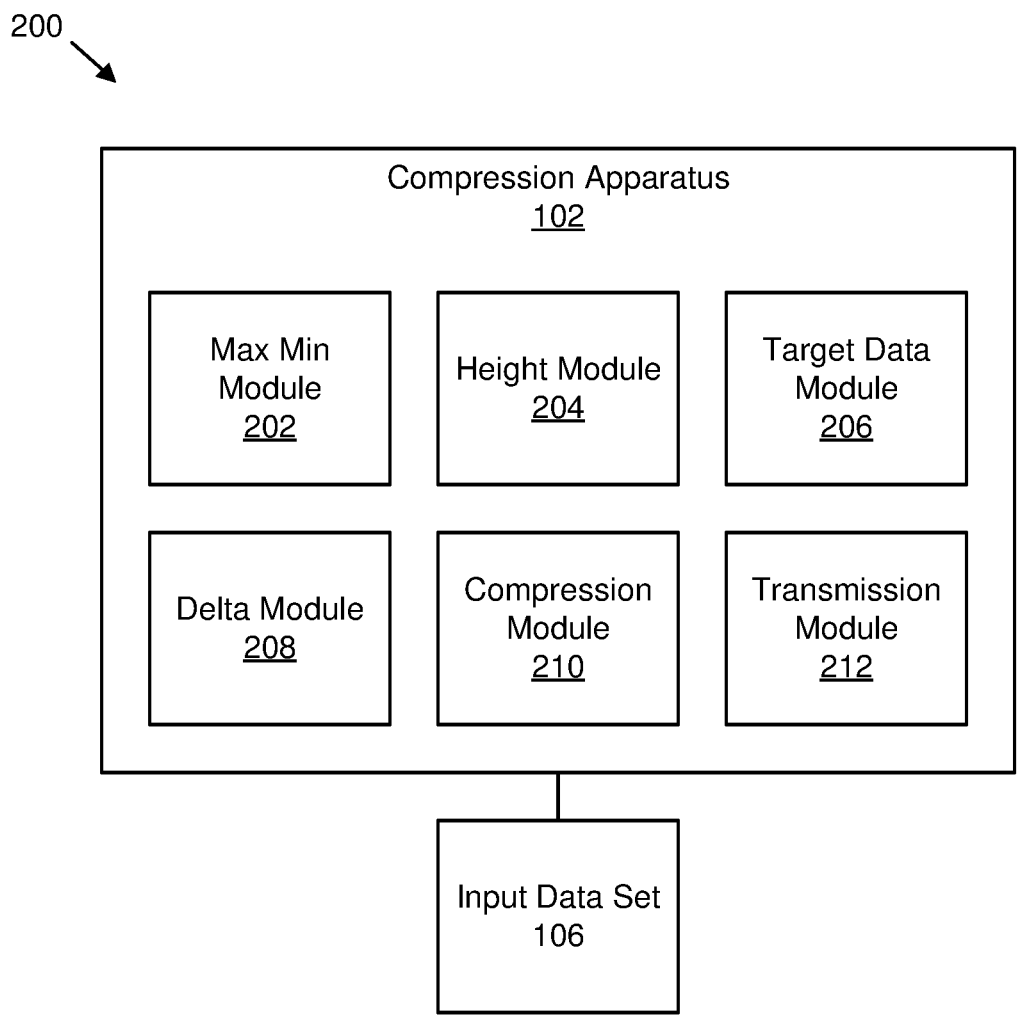
FIG. 2 is a schematic block diagram illustrating an apparatus for an improved user interface experience by using compression, according to various embodiments.

FIG. 2 is a schematic block diagram illustrating an apparatus 200 for an improved user interface experience by using compression, according to various embodiments. The apparatus 200 includes a compression apparatus 102 communicatively coupled to the input data set 106 where the compression apparatus 102 includes a max min module 202, a height module 204, a target data module 206, a delta module 208, a compression module 210, and a transmission module 212, which are described below.

The max min module 202 is configured to identify a maximum value and a minimum value in an input data set 106 in response to a request to display data from the input data set 106. The input data set 106 includes a plurality of entries where each entry includes at least a first value paired with a second value. In other embodiments, the input data set 106 includes other values in an entry each paired with the first value. The first values are ordered sequentially and the maximum value and the minimum value are second values. In some embodiments, the max min module 202 parses the input data set 106 to search for a maximum value and to search for a minimum value.

The input data set 106 is remote from a display location. In some embodiments, the display location is at an information handling device 110 and the input data set 106 is at a location or accessible to the server 104 where the server 104 and the information handling device 110 communicate via the computer network 108.

The apparatus 200 includes a height module 204 configured to calculate a difference between the minimum value and the maximum value where the difference is a height. In some examples, the height module 204 subtracts the minimum value from the maximum value to find the height. In some embodiments, the minimum value and the maximum value are negative and the height module 204 finds the absolute value of the difference between the first value and the second value.

The apparatus 200 includes a target data module 206 configured to determine a target data amount to be downloaded to a user display interface to satisfy user interface quality experience criteria. In some embodiments, the user interface quality experience criteria is an amount of time acceptable to a user to display data after a request to display the data. For example, the user interface quality experience criteria may include a target amount of time to display the data after the request to display the data. The time is a target amount of time rather than an exact amount of time because actual downloading is often affected by changing download speeds of the computer network 108, varying processing times, etc. For example, the target amount of time may be three seconds where longer display times may be deemed bothersome to the user. In other embodiments, the target amount of time is 5 second, 10 seconds, or other amount of time deemed acceptable to a user.

In some cases, the time it takes to download data is the most significant part of the total time it takes to display the data so processing time may be ignored. In other embodiments, the target data module 206 takes into account processing time in addition to an amount of time to download the data. For example, where the target amount of time is three seconds, the processing time may be 0.5 seconds leaving 2.5 seconds to download the data. In some embodiments, the processing time is related to the information handling device 110 displaying the data. In other embodiments, the processing time includes processing time of the compression apparatus 102. In other embodiments, the processing time includes processing time at both the information handling device 110 and the compression apparatus 102. In some embodiments, once the target data module 206 determines the target amount of time, the target data module 206 uses a transmission rate to determine the target data amount. For example, where the transmission rate is 600 megabits ("MB") per second ("S"), and the target amount of time is 2.5 seconds, the target data module 206 determines the target amount of data as (600 MB/S)(2.5 S)=1.5 gigabits ("GB").

In some embodiments, the target data module 206 uses a machine learning algorithm to determine the target data amount. For example, processing time, transmission rates, and other factors may be intertwined and may also vary based on transmission speed. In addition, different information handling devices 110 may vary in amount of time to display data. In some embodiments, the target data module 206 includes a training mode that gathers data for different instances of displaying data where the data gathered includes, amount of data transmitted to the information handling device 110, information about the information handling device 110, times to display data along with related transmission rates, calculated processing times, etc. and then uses a machine learning algorithm to correlate display times with transmission rates, types of information handling devices 110, etc. The target data module 206 then uses information about the information handling device 110, a current or known transmission rate, a calculated processing time for the situation, etc. to determine the target data amount. In some embodiments, the machine learning algorithm of the target data module 206 updates results over time as additional data is gathered. One of skill in the art will recognize other ways for the target data module 206 to determine a target data amount.

The apparatus 200 includes a delta module 208 configured to calculate a difference level for a compression algorithm and a compression module 210 configured to process the input data set 106 with the compression algorithm and the difference level to create the compressed data set. The difference level is used with the compression algorithm to select entries of the input data set to be stored in a compressed data set and is based on the input data set 106, the target data amount and the height. The difference level, in some embodiments, is based on a size of the input data set 106 compared with the target data amount. In other embodiments, the difference level is based on a number of first values in the input data set 106 and an expected number of first values of a compressed data set that is close in size to the target data amount.

In some embodiments, the difference level is a value less than the height and sized so that applying the compression algorithm results in a compressed data set that is close to the target data amount. Typically, applying the compression algorithm results in compressed data sets that differ in size even when the associated input data sets 106 are the same size. For example, an input data set 106 with a lot of variation may result in a larger compressed data set than an input data set 106 of the same size but with little variation.

In certain embodiments, the compression algorithm may be a lossy compression algorithm such as transform coding, discrete cosine transform, discrete wavelet transform, fractal compression, or the like. In further embodiments, the compression algorithm may be a lossless compression algorithm such as run length encoding, Lempel-Ziv-Welch, Huffman coding, arithmetic encoding, or the like.

In some embodiments, the compression algorithm only keeps important measurement data and drops unnecessary or redundant values such that trends, peaks, valleys, and/or other variations in the measurement data are preserved in the compressed measurement data set. In such embodiments, the compression module 210 creates a compressed data set by identifying and storing values that fall outside of a range that is dynamically calculated for each value in the measurement data based on the difference level.

In particular, the compression module 210 uses a compression algorithm that finds a next entry to store in the compressed data set using:

$$|C_{def} - P_{def}| > \Delta_{def}$$

where:
$C_{def}$ is a second value being currently processed by the compression algorithm;
$P_{def}$ is a most recent previously stored second value in the compressed data set; and
$\Delta_{def}$ is the difference level for the input data set.

For example, the difference level may be 5 and a small section of the input data set 106 along with the compressed data set is depicted in Table 1:

TABLE 1

| Input Data Set and Compressed Data Set | | |
|---|---|---|
| Number | Input | Compressed |
| 0 | 50 | 50 |
| 1 | 50 | |
| 2 | 51 | |
| 3 | 52 | |
| 4 | 52 | |
| 5 | 56 | 56 |
| 6 | 56 | |
| 7 | 57 | |
| 8 | 55 | |
| 9 | 49 | 49 |
| 10 | 50 | |
| 11 | 55 | 55 |
| 12 | 55 | |
| 13 | 56 | |
| 14 | 58 | |
| 15 | 58 | |
| 16 | 59 | |
| 17 | 61 | 61 |
| 18 | 59 | |
| 19 | 58 | |

TABLE 1-continued

| Input Data Set and Compressed Data Set | | |
|---|---|---|
| Number | Input | Compressed |
| 20 | 55 | |
| 21 | 55 | |

The first values are in the "Number" column and the second values of the input data set 106 are in the "Input" column. The compressed data set includes the first values and associated compressed values in the "Compressed" column and would take the form of [(0, 50), (5, 56), (9, 49), (11, 55), (17, 61), ...]. The compression module 210 looks for a difference between a most recent previously stored value in the compressed data set and a current value being processed to be greater than the difference level. Looking at Table 1, the compression module 210 stores the first data value and, in some embodiments, stores the last value of the input data set 106. Where the first value is number 0 and is paired with a second value of 50, the compression module 210 stores (0, 50). When the compression module 210 processes the second entry (1, 50), there is no difference between the stored compressed value of 50 and the second value of 50 in the second entry so the compression module 210 does not store a value for the second entry.

When the compression module 210 proceeds to process the sixth entry of (5, 56), the difference between the last stored compressed value of 50 (in the first entry) and the second value of the sixth entry that is being currently processed, which is a value of 56, the difference is 6, which is greater than the delta of 5 so the compression module 210 stores the sixth entry, as depicted in Table 1. The compression module 210 then proceeds to the next entry. When the compression module 210 processes the tenth entry of (9, 49), the last compressed entry that was stored is 56 so that the difference is 7, which is greater than 5 so the compression module 210 stores the tenth entry of (9, 49) in the compressed data set. The compression module 210 continues until all entries of the input data set 106 are processed, thus creating the compressed data set.

The apparatus 200 includes a transmission module 212 configured to transmit the compressed data set for display. After the compression module 210 creates the compressed data set, the transmission module 212, in some embodiments, transmits the compressed data set to the information handling device 110 and the display apparatus 112 displays the compressed data set. In some embodiments, the transmission module 212 sends a message to the information handling device 110 indicating that the compressed data set is available for download. As used herein, transmitting the compressed data set includes transmission of the compressed data set as well as notifying the information handling device 110 that the compressed data set is available for download or any other action that results in the compressed data set being transferred to the information handling device 110 for display.

In some embodiments, the compressed data set may be too large to display and satisfy the user interface quality experience criteria. Note that where the difference level is smaller, for example, 3 instead of 5, the compression module 210 will store more entries. Conversely, where the difference level is larger, 7 instead of 5, the compression module 210 will store less entries. Thus, the delta module 208 is used to adjust the difference level to seek to create a compressed data set that is comparable to the target data amount.

In some embodiments, the delta module 208 calculates a difference level and the compression module 210 processes the input data set 106 using the compression algorithm and the difference level to produce a compressed data set. The delta module 208 then compares the size compressed data set with the target data amount to determine a size difference between the size of the compressed data set and to the target data amount. If the size difference is less than a size difference threshold, the transmission module 212 transmits the compressed data set. For example, the size difference threshold may be 10 percent of the target data amount. For example, where target data amount is 1 GB, the size difference threshold may be 100 MB. Other size difference thresholds may be used, such as 1 percent, 5 percent, 20 percent, or any other value that will produce a compressed data set close enough in size to the target data amount to satisfy the user interface quality experience criteria.

If the size difference is greater than a size difference threshold, the delta module 208 increases the difference level and the compression module 210 reprocesses the input data set 106. The delta module 208 again compares the size of the resulting compressed data set with the target data amount and if the size difference is less than the size difference threshold, the transmission module 212 transmits the compressed data set. In some embodiments, the delta module 208 and the compression module 210 iterate and modify the difference level to produce a compressed data set sized to be within the size difference threshold of the target data amount.

In other embodiments, the delta module 208 uses a delta machine learning algorithm to adjust how the delta module 208 calculates the difference level over time. For example, the delta module 208 may gather data in a training mode, such as sizes of input data sets 106, compressed data sets, and the difference levels used and the delta machine learning algorithm then uses the stored data to adjust how the delta module 208 calculates the difference level. In some embodiments, the delta machine learning algorithm of the delta module 208 updates results over time as additional data is gathered.

In some embodiments, the delta module 208 calculates the difference level for the input data set 106 using a function of the height customized based on the target data amount and a number of first values in the input data set 106. For example, the delta module 208 may use the equation: $\Delta_{def} = |\log_2(h_{def})|$ where $\Delta_{def}$ is the difference level for the input data set 106 and $h_{def}$ is the height of the input data set 106.

In other embodiments, the delta module 208 calculates the difference level for the input data set 106 using a compression scaler multiplied by a function of the height where the compression scalar is for the input data set 106 and includes a scalar derived from the target data amount and a number of first values in the input data set 106. In some embodiments, the delta module 208 uses the equation: $\Delta_{def} = |\log_2(h_{def})| * S_{def}$ where $\Delta_{def}$ is the difference level for the input data set, $h_{def}$ is the height of the input data set, and $S_{def}$ is a compression scalar of the input data set and includes a scalar derived from the target data amount and a number of first values in the input data set. While a log base 2 function is depicted, in other embodiments other functions are used, such as a log base 10 function. Other embodiments may use other functions.

In some embodiments, the compression scalar is a ratio of the target data amount and a size of the input data set 106. In other embodiments, the compression ratio is a ratio of a projected number of first values of a compressed data set complying with the target data amount and the number of first values in the input data set 106. For example, where the compressed data set includes first values and second values, the projected number of first values may be derived by cutting the target data amount in half and then determining how many first values would be in the halved target data amount, which would take into account the number of bits in each first value. In embodiments where the input data set 106 and the resulting compressed data set include more than just first and second values (e.g. third values, fourth values, etc.), the delta module 208 divides the target data amount appropriately to determine a projected number of first values in the compressed data set. One of skill in the art will recognize other ways for the delta module 208 to calculate the compression scalar.

Figure 3:
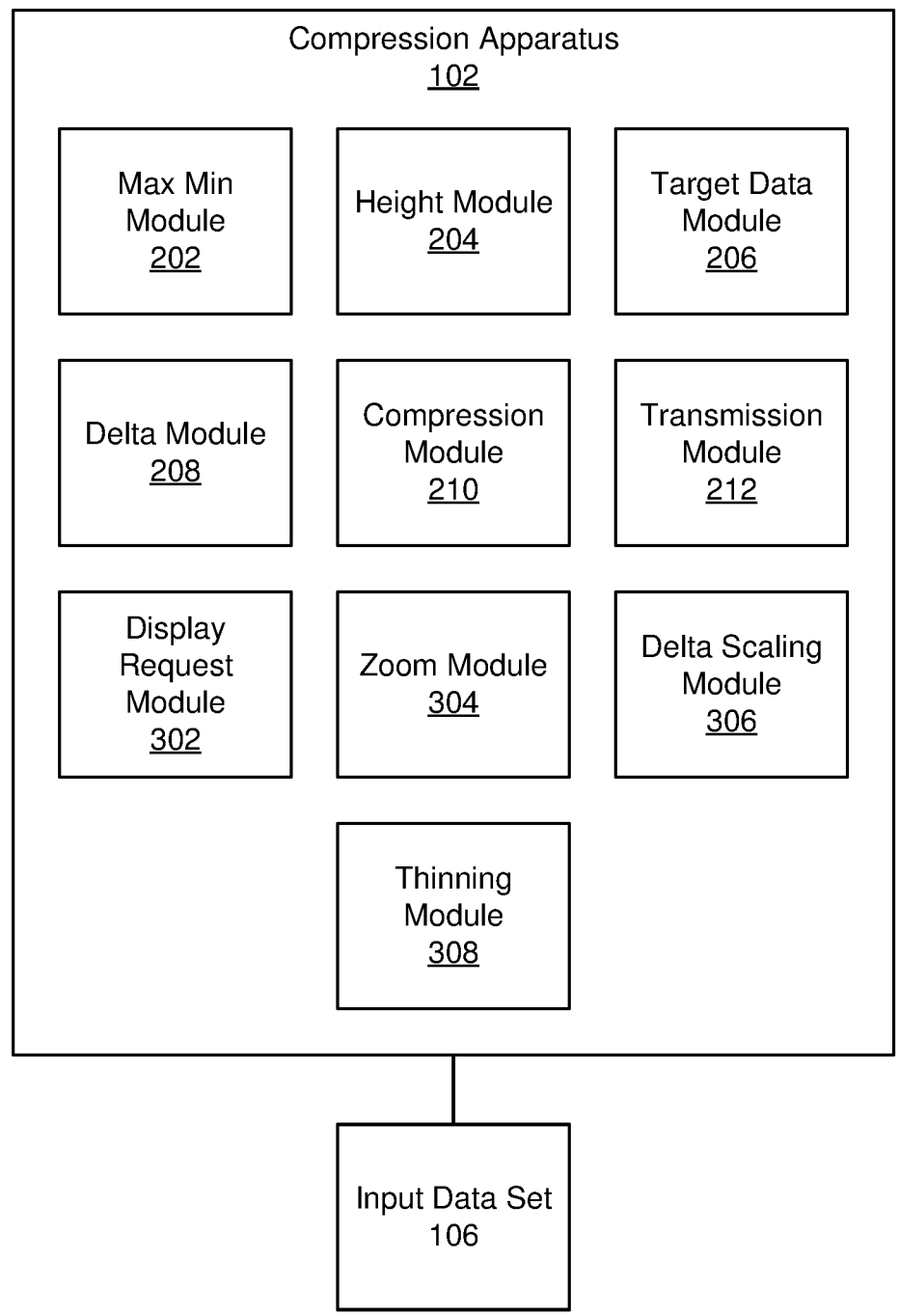
FIG. 3 is a schematic block diagram illustrating another apparatus for an improved user interface experience by using compression, according to various embodiments.

FIG. 3 is a schematic block diagram illustrating another apparatus 300 for an improved user interface experience by using compression, according to various embodiments. The apparatus 300 includes another compression apparatus 102 communicatively coupled to the input data set 106 where the compression apparatus 102 includes a max min module 202, a height module 204, a target data module 206, a delta module 208, a compression module 210, and a transmission module 212, which are substantially similar to those described above in relation to the apparatus 200 of FIG. 2. The compression apparatus 102 also includes a display request module 302, a zoom module 304, a delta scaling module 306, and/or a thinning module 308, which are described below.

The apparatus 300, in some embodiments, includes a display request module 302 configured to receive a request from an information handling device 110 to transmit data of the input data set 106 for display. The information handling device 110 is remote from the input data set 106 and/or the compression apparatus 102. In some examples, the information handling device 110 is running an application that sends the request to the compression apparatus 102. For example, the information handling device 110 may be running an application programming interface ("API") that is able to access an application running the compression apparatus 102.

In other embodiments, the information handling device 110 is running an application that has access to the input data set 106 and other data. In some examples, the input data set 106 includes data from a system monitoring application and the compression apparatus 102 is part of or compliments the system monitoring application to enable transfer of data from the input data set 106. In the examples, the information handling device 110 includes an interface to the system monitoring application and sends the request to transmit data from the input data set 106 for display. One of skill in the art will recognize other ways for the information handling device 110 to access or interface with the compression apparatus 102 and to send a request to transmit data from the input data set 106 for display.

The apparatus 300 includes, in some embodiments, a zoom module 304 configured to, in response to a request to display data from a subset of the input data set 106, optionally identify a maximum value and a minimum value of the subset, optionally subtract the minimum value from the maximum value of the subset to calculate a height for the subset, calculate a difference level for the subset, process the subset with the compression algorithm and the difference level of the subset to create a compressed subset, and transmit the compressed subset for display. The difference level is used with the compression algorithm to select entries to be stored in the compressed subset and is based on the target data amount and the height of the subset. The compressed data set is for a default range of first values in the input data set 106 and the subset is a portion of first values of the input data set 106. In some embodiments, the zoom module 304 identifies a maximum value and a minimum value of the subset and subtract the minimum value from the maximum value of the subset to calculate a height for the subset. In other embodiments, the zoom module 304 uses the height calculated for the entire input data set 106.

In some embodiments, the zoom module 304 calculates a difference level for the subset using a same method as the delta module 208 derives the difference level for the input data set 106. In some embodiments, the zoom module 304 uses the delta module 208 to derive the difference level for the subset but substitutes information about the subset in place of information about the input data set 106. In some embodiments, the zoom module 304 uses a formula to create a difference level for the subset that will attempt to produce a compressed data set that is within a size difference threshold of the target data amount. In other embodiments, the zoom module 304 uses the delta module 208 and the compression module 210 to iterate to get an appropriate difference level for the subset to get an appropriately sized subset. For example, the zoom module 304 may use the delta module 208 to produce a small difference level for the subset that will produce a compressed data set that is presumably too large and the iterates using the delta module 208 and the compression module 210 until the compressed data set is sized small enough to be within the size difference threshold of the target data amount.

Advantageously, the target data amount stays the same while the amount of data in the subset is less so that the zoom module 304 calculates an appropriate difference level that will naturally include more detail than the compressed data set because the number of first values in the subset is less than the first values in the input data set 106 while the target data amount has not changed. Thus, the difference level is adjusted so that the compression algorithm is less aggressive.

The apparatus 300 includes, in some embodiments, a delta scaling module 306 configured to multiply the difference level of the input data set 106 by a compression scalar of the subset. In some embodiments, the compression scalar of the subset is a ratio of a number of first values in the subset divided by the number of first values in the input data set 106. For example, if there are 200 first values in the subset and 1,000 first values in the input data set 106, the compression scalar for the subset is 200/1,000=0.2 so the delta scaling module 306 multiplies the difference level of the input data set 106. For example, the difference level for the input data set 106 may be 5 so 5*0.2=1. The difference level for the subset would be 1. Having a smaller difference level than the difference level of the input data set 106 will result in storing a higher percentage of entries in the compressed data set. Since the subset is smaller than the input data set 106, storing a higher percentage of entries will typically result in a compressed data set that is similar in size to the compressed data set of the input data set 106.

Some input data sets 106 may include sections with a lot of variation and sections with less variation. In the sections with a lot of variation, having a less aggressive compression algorithm results in having enough detail to show the variation. In areas with little variation, a more aggressive compression algorithm saves less points. The apparatus 300, in some embodiments, includes a thinning module 308 configured to, prior to transmitting the compressed data set, identify a section of the compressed data set with a low amount of variation, increase the difference level for the section of the compressed data, reprocess, using the compression algorithm, the section of the compressed data set using the increased difference level, replace the section of the compressed data set with entries from reprocessing the section to produce a modified compressed data set, and then transmitting the modified compressed data set.

In some embodiments, the thinning module 308 keeps track of variation of the input data set 106 or a subset of the input data set 106 while the input data set 106 or the subset is being parsed for determining the minimum value and maximum value or is being parsed during processing by the compression algorithm. In some examples, the thinning module 308 looks for variations beyond a particular limit within a certain number of first values to identify a section with a lot of variation or the thinning module 308 looks for sections with variations beyond a limit to be less than a certain number within a section of the input data set 106/compressed data set. Once the thinning module 308 has identified at least one section with little variation, the thinning module 308 increases the difference level used for compression and reprocesses the section using the compression algorithm and the increased difference level, which will result in less entries being stored in the compressed data set. The entries for the section that result from the reprocessing are then used to replace the compressed data in the section of the compressed data set and the transmission module 212 then transmits the modified compressed data set.

Figure 4A:
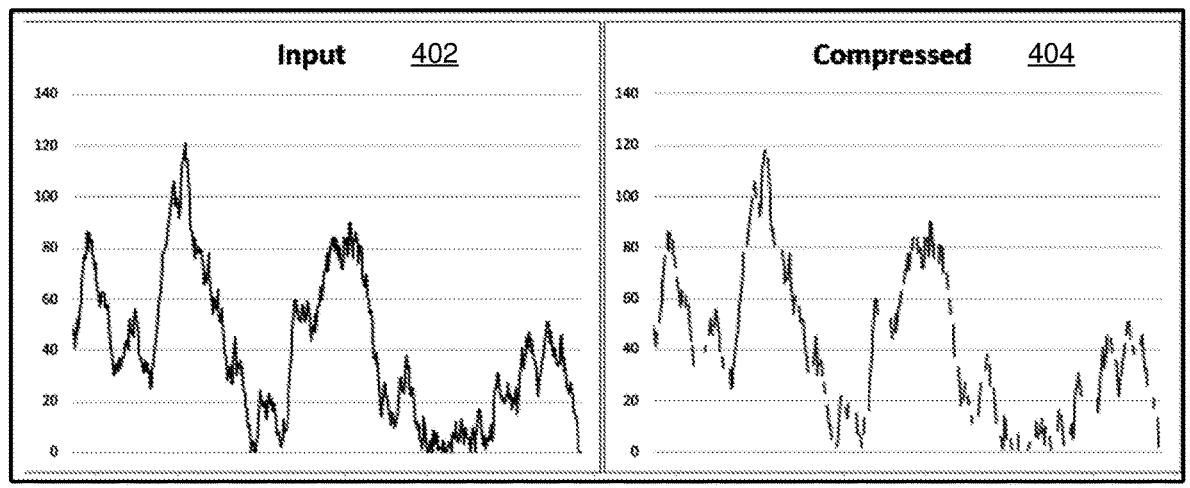
FIG. 4A is a diagram illustrating a display of an input data set and a compressed data set with a lot of variation.
Figure 4B:
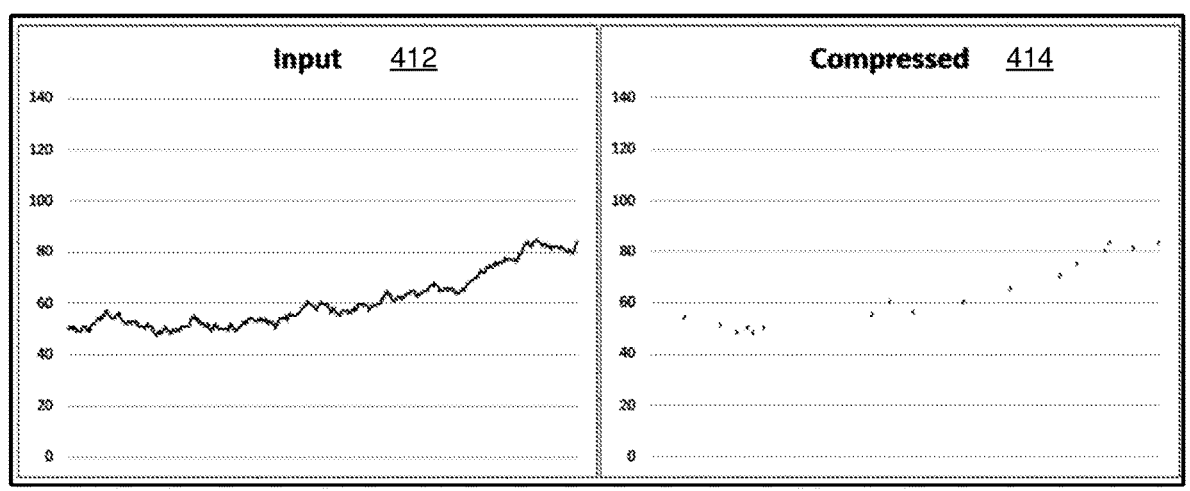
FIG. 4B is a diagram illustrating a display of an input data set and a compressed data set with little variation.

FIGS. 4A, 4B, 5A, and 5B are diagrams 400, 410, 500, 510 of input data sets 106 with the compression algorithm applied. FIG. 4A is a diagram 400 illustrating a display of an input data set 402 and a resulting compressed data set 404 with a lot of variation. The display of the input data set 402 includes all of the points of the input data set 106, which appear as a continuous line due to the number of points. The display of the compressed data set 404 depicts the corresponding compressed data set, which includes gaps. FIG. 4B is a diagram 410 illustrating a display of an input data set 412 and a compressed data set 414 with little variation. Again, the display of the input data set 412 looks like a solid line because so many points are included. However, the display of the compressed data set 414 is sparse with large gaps between points due to the variation being low.

Figure 5A:
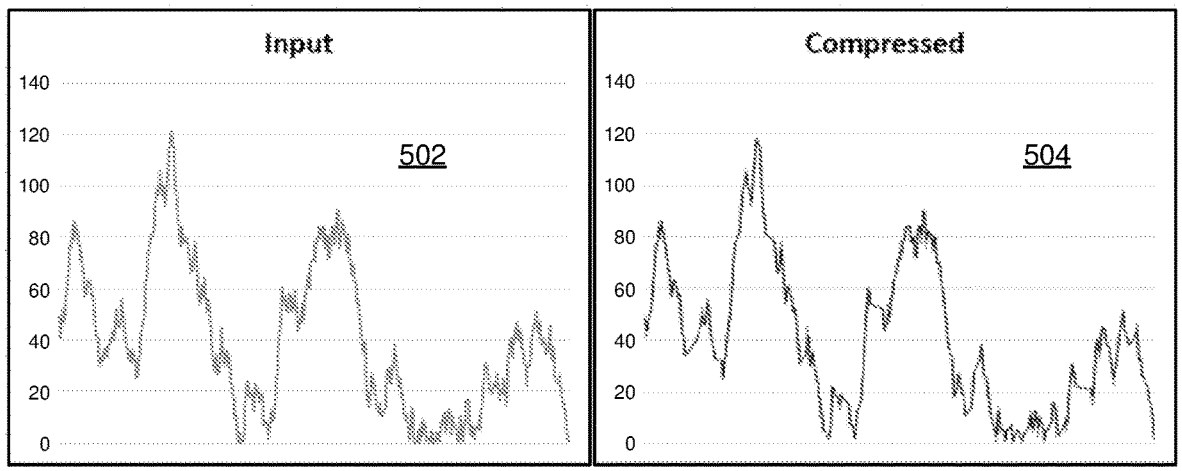
FIG. 5A is a diagram illustrating a display of an input data set and a compressed data set with a lot of variation and lines connecting the points of the compressed data set.
Figure 5B:
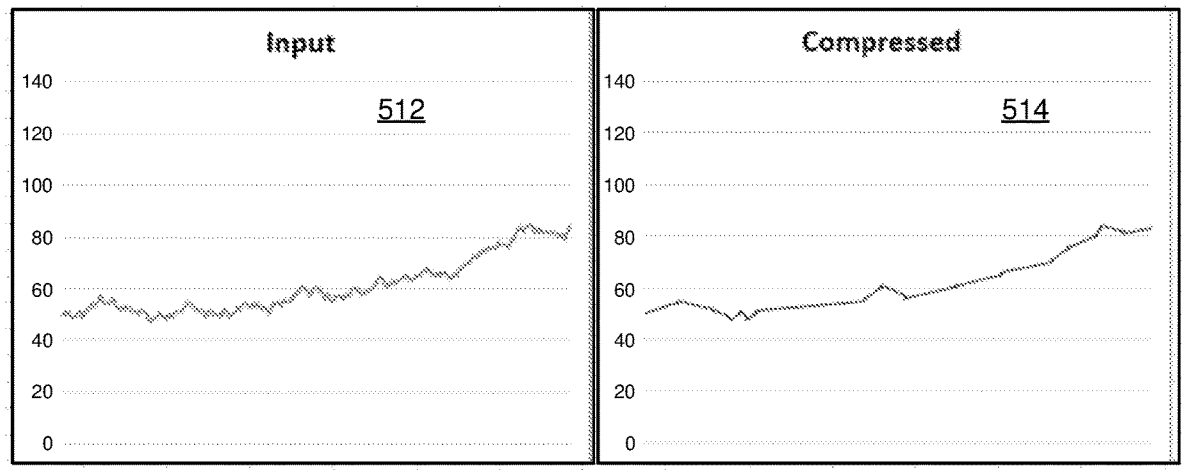
FIG. 5B is a diagram illustrating a display of an input data set and a compressed data set with little variation and lines connecting the points of the compressed data set.

FIG. 5A is a diagram 500 illustrating a display of an input data set 502 and a compressed data set 504 with a lot of variation and lines connecting the points of the compressed data set. Note that the display of the compressed data set 504 of FIG. 5A includes the data points of the display of the compressed data set 404 from FIG. 4A with lines added between the points. The resulting display 504 has solid lines and appears to be very similar to the display of the input data set 502. FIG. 5B is a diagram 510 illustrating a display of an input data set 512 and a compressed data set 514 with little variation and lines connecting the points of the compressed data set. Comparing the display of the compressed data set 414 from FIG. 4B with the display of the compressed data set 514 with lines between the points from FIG. 5B, again the display of the compressed data set 514 in FIG. 5B with lines between the points appears to be very similar to the display of the input data set 512.

In the examples of FIGS. 4A, 4B, 5A and 5B, the input data set 106 for FIGS. 4A and 5A clearly would include more data in the compressed data set than the input data set 106 for FIGS. 4B and 5B and are included to demonstrate that the compression algorithm may result in a lot of points in the compressed data set where there is a lot of variation and may result in few points in the compressed data set where there is little variation and in both cases the resulting compressed data sets with lines connecting the points provide a reasonable representation of the input data sets 106.

With an input data set 106 with a lot of variation, the resulting compressed data set may be too large to satisfy the user interface quality experience criteria so that a larger difference level may be used, which will result in fewer points in the compressed data set so that the compressed data set is closer to the target data amount. The resulting display will not show as much detail as with a smaller difference level. However, the compression apparatus 102 provides a mechanism to zoom in and display more detail where the initial display and the zoomed display both result in satisfying the user interface quality experience criteria. Zooming in provides more detail and at some level, zooming in may result in no compression at all.

Figure 6:
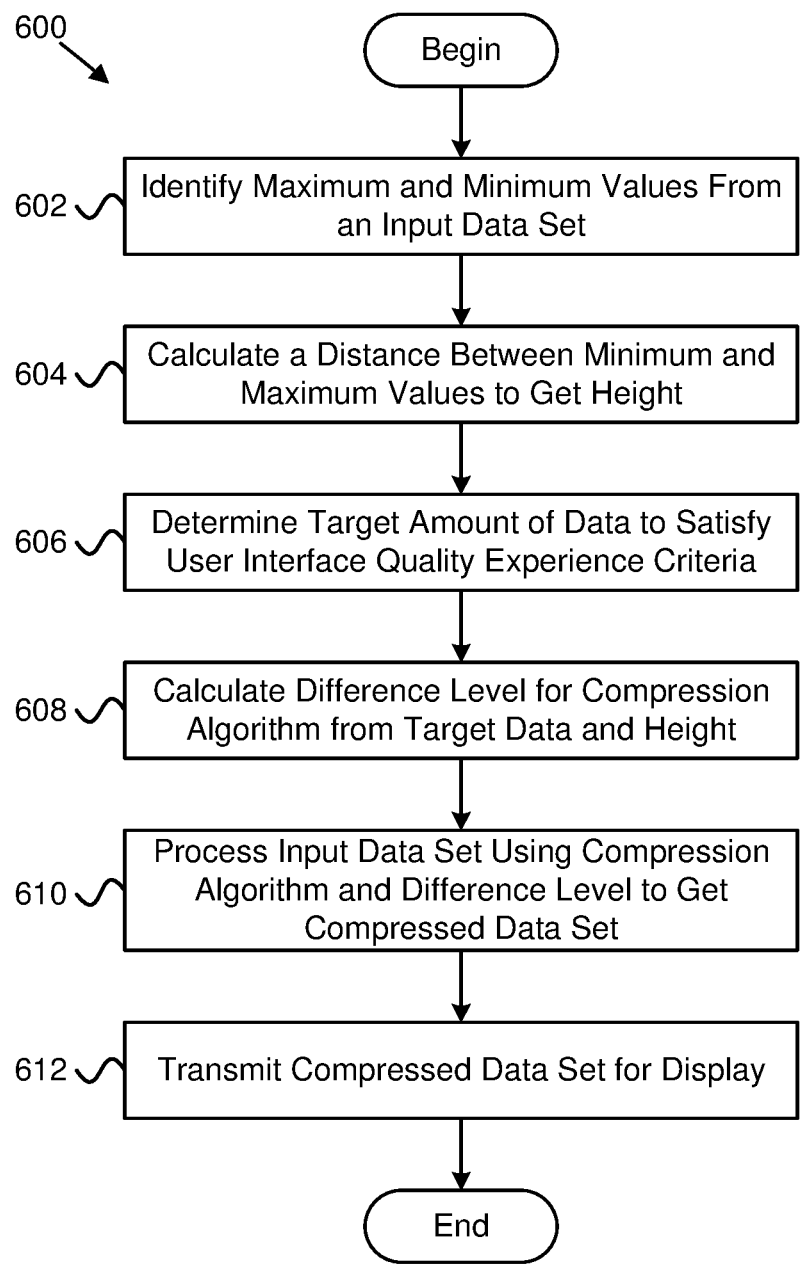
FIG. 6 is a schematic flow chart diagram illustrating a method for an improved user interface experience by using compression, according to various embodiments.

FIG. 6 is a schematic flow chart diagram illustrating a method 600 for an improved user interface experience by using compression, according to various embodiments. The method 600 begins and identifies 602 a maximum value and a minimum value in an input data set 106 in response to a request to display data from the input data set 106. The input data set 106 is remote from a display location and the input data set 106 includes a plurality of entries. Each entry has a first value and a second value where the first values are ordered sequentially and the maximum value and the minimum value are second values. The method 600 calculates 604 a difference between the minimum value and the maximum value where the difference is a height.

The method 600 determines 606 a target data amount to be downloaded to a user display interface to satisfy user interface quality experience criteria and calculates 608 a difference level for a compression algorithm. The difference level is used with the compression algorithm to select entries of the input data set 106 to be stored in a compressed data set and is based on the target data amount and the height. The method 600 processes 610 the input data set with the compression algorithm and the difference level to create the compressed data set and transmits 612 the compressed data set for display, and the method 600 ends. In various embodiments, some or all of the method 600 is implemented using the max min module 202, the height module 204, the target data module 206, the delta module 208, the compression module 210, and/or the transmission module 212.

Figure 7:
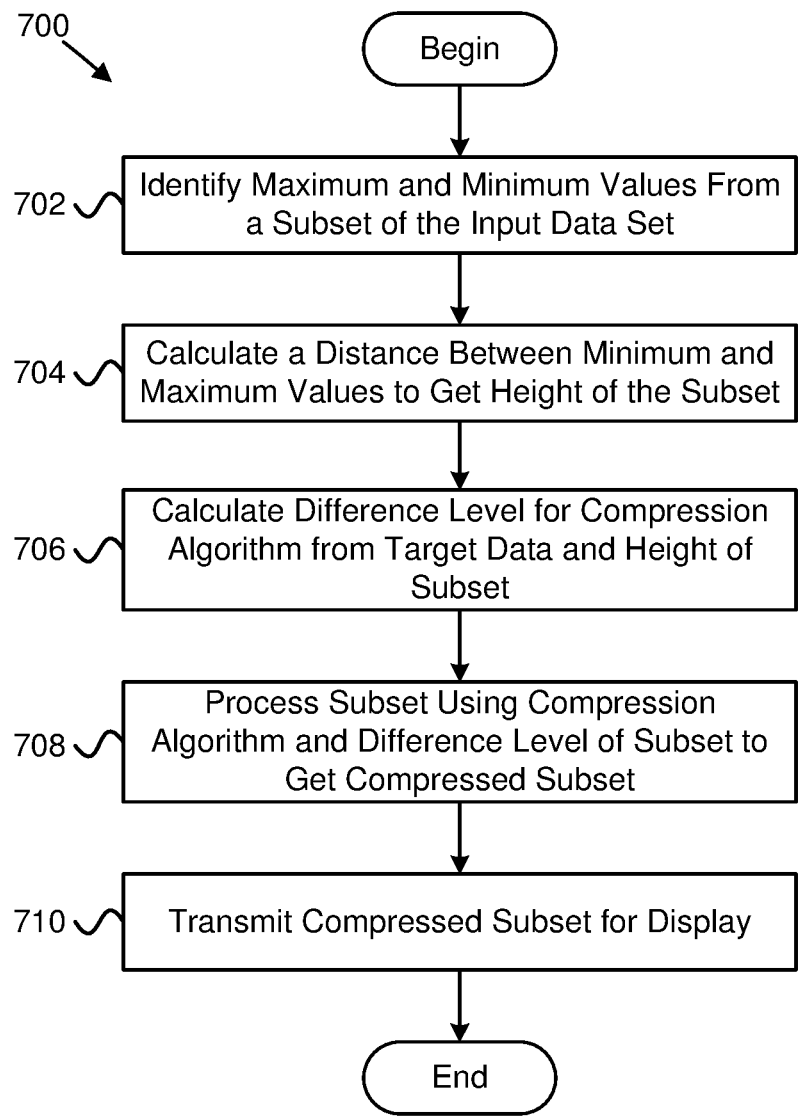
FIG. 7 is a schematic flow chart diagram illustrating a method for an improved user interface experience by using compression after a zoom command, according to various embodiments.

FIG. 7 is a schematic flow chart diagram illustrating a method 700 for an improved user interface experience by using compression after a zoom command, according to various embodiments. The method 700 begins and, in response to a request to display data from a subset of the input data set 106, optionally identifies 702 a maximum value and a minimum value of the subset and optionally calculates 704 a difference between the minimum value and the maximum value of the subset where the difference is a height of the subset. In other embodiments (not shown), the method 700 does not identify 702 a maximum value and a minimum value of the subset or calculate 704 and instead uses the height of the input data set 106.

The method 700 calculates 706 a difference level for the subset. The difference level is used with the compression algorithm to select entries to be stored in a compressed subset and is based on the subset, the target data amount and the height of the subset. The method 700 processes 708 the subset with the compression algorithm and the difference level of the subset to create the compressed subset and transmits 710 the compressed subset for display, and the method 700 ends. In various embodiments, some or all of the method 700 is implemented using the max min module 202, the height module 204, the target data module 206, the delta module 208, the compression module 210, the transmission module 212, the display request module 302, the zoom module 304, and/or the delta scaling module 306.

Figure 8:
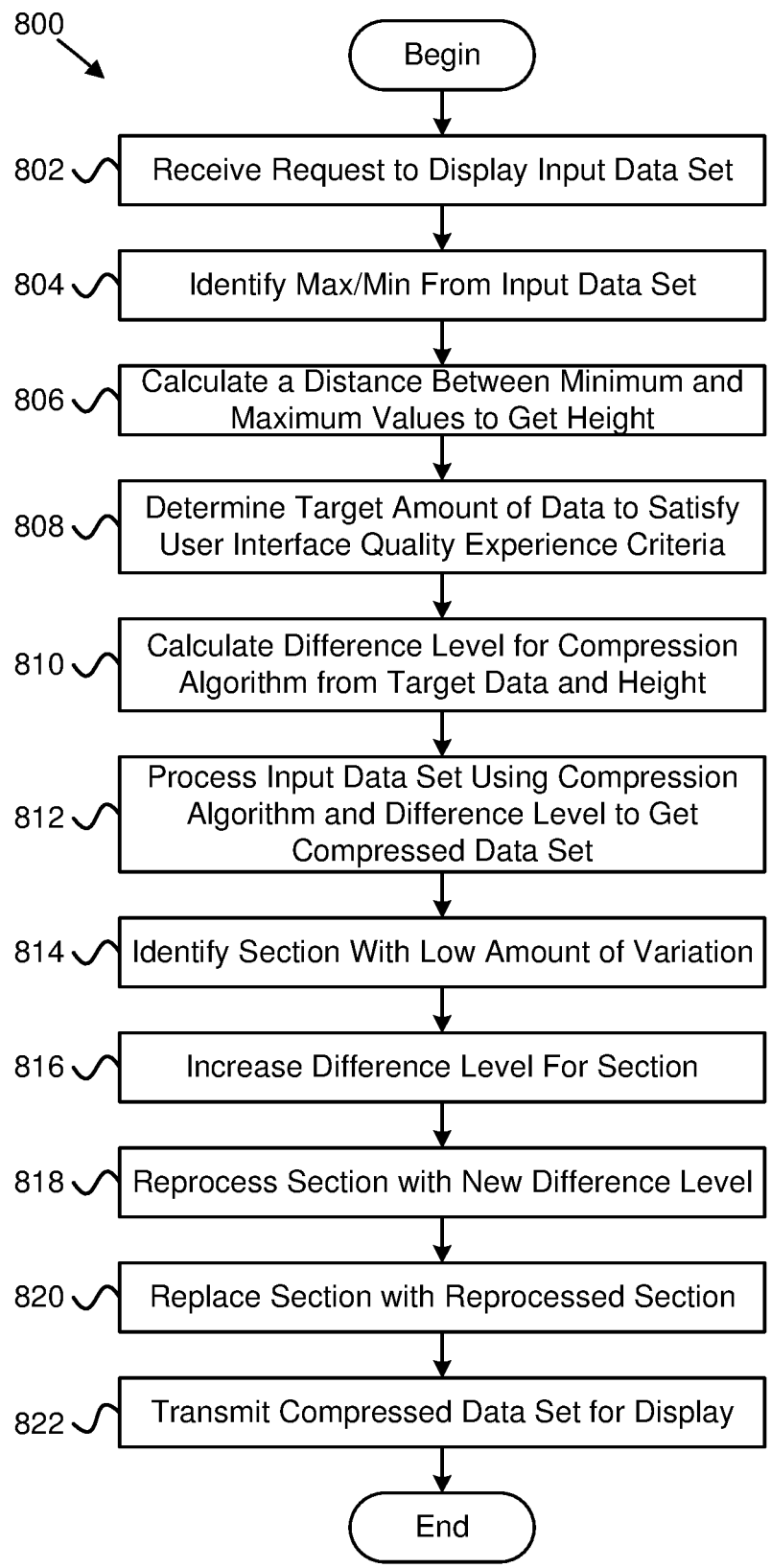
FIG. 8 is a schematic flow chart diagram illustrating a method for an improved user interface experience by using compression where a section with little variation is replaced after reprocessing the section, according to various embodiments.

FIG. 8 is a schematic flow chart diagram illustrating a method 800 for an improved user interface experience by using compression where a section with little variation is replaced after reprocessing the section, according to various embodiments. The method 800 begins and receives 802 a request to display data from the input data set 106 and identifies 804 a maximum value and a minimum value in an input data set 106. The input data set 106 is remote from a display location and the input data set 106 includes a plurality of entries. Each entry has a first value and a second value where the first values are ordered sequentially and the maximum value and the minimum value are second values. The method 800 calculates 806 a difference between the minimum value and the maximum value where the difference is a height and determines 808 a target data amount to be downloaded to a user display interface to satisfy user interface quality experience criteria.

The method 800 calculates 810 a difference level for a compression algorithm where the difference level is used with the compression algorithm to select entries of the input data set 106 to be stored in a compressed data set and is based on the input data set 106, the target data amount and the height. The method 800 processes 812 the input data set 106 with the compression algorithm and the difference level to create the compressed data set. The method 800 identifies 814 a section of the compressed data set with a low amount of variation and increases 816 the difference level for the section of the compressed data set. The method 800 reprocesses 818, using the compression algorithm, the section of the compressed data set using the increased difference level, replaces 820 the section of the compressed data set with entries from reprocessing the section to produce a modified compressed data set, and transmits 822 the modified compressed data set for display, and the method 800 ends. In various embodiments, some or all of the method 800 is implemented using the max min module 202, the height module 204, the target data module 206, the delta module 208, the compression module 210, the transmission module 212, the display request module 302, the zoom module 304, the delta scaling module 306, and/or the thinning module 308.

Embodiments may be practiced in other specific forms. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method comprising:
   identifying a maximum value and a minimum value in an input data set in response to a request to display data from the input data set, the input data set remote from a display location, the input data set comprising a plurality of entries, each entry comprising a first value and a second value, wherein the first values are ordered sequentially and the maximum value and the minimum value are second values;
   calculating a difference between the minimum value and the maximum value, wherein the difference is a height;
   determining a target data amount to be downloaded to a user display interface to satisfy user interface quality experience criteria;

calculating a difference level for a compression algorithm, wherein the difference level is used with the compression algorithm to select entries of the input data set to be stored in a compressed data set and is based on the input data set, the target data amount and the height;

processing the input data set with the compression algorithm and the difference level to create the compressed data set; and transmitting the compressed data set for display.

2. The method of claim 1, wherein the compressed data set is for a default range of first values in the input data set and further comprising, in response to a request to display data from a subset of the input data set:

identifying a maximum value and a minimum value of the subset;

calculating a difference between the minimum value and the maximum value of the subset, wherein the difference is a height of the subset;

calculating a difference level for the subset, wherein the difference level is used with the compression algorithm to select entries to be stored in a compressed subset and is based on the subset, the target data amount and the height of the subset;

processing the subset with the compression algorithm and the difference level of the subset to create the compressed subset; and transmitting the compressed subset for display.

3. The method of claim 2, wherein the difference level for the subset is calculated as $\Delta_{zoom} = |\log_2(h_{sub})| * S_{def} * S_{sub}$, where:

$\Delta_{zoom}$ is the difference level for the subset;

$h_{sub}$ is the height of the subset;

$S_{def}$ is a compression scalar of the input data set and comprises a scalar derived from the target data amount and a number of first values in the input data set; and $S_{sub}$ is a compression scalar of the subset and comprises a scalar derived from the target data amount and a total number of first values in the subset.

4. The method of claim 3, wherein the compression scalar of the subset comprises a compression scalar for the input data set multiplied by a ratio of a number of first values of the subset divided by a number of first values of the input data set.

5. The method of claim 1, wherein the difference level for the input data set is calculated:

using a function of the height customized based on the target data amount and a number of first values in the input data set; or using a compression scaler multiplied by a function of the height, wherein the compression scalar is for the input data set and comprises a scalar derived from the target data amount and a number of first values in the input data set.

6. The method of claim 1, wherein the difference level is calculated as $\Delta_{def} = |\log_2(h_{def})| * S_{def}$, where:

$\Delta_{def}$ is the difference level for the input data set;

$h_{def}$ is the height of the input data set; and $S_{def}$ is a compression scalar of the input data set and comprises a scalar derived from the target data amount and a number of first values in the input data set.

7. The method of claim 1, wherein the target data amount is based on the user interface quality experience criteria and a transmission rate.

8. The method of claim 1, wherein the target data amount is adjusted based on the user interface quality experience criteria and a current transmission rate for transmitting data to the display location.

9. The method of claim 1, wherein the compression algorithm finds a next entry to store in the compressed data set using:

$$|C_{def} - P_{def}| > \Delta_{def}$$

where:

$P_{def}$ is a most recent previously stored second value in the compressed data set;

$\Delta_{def}$ is the difference level for the input data set; and $C_{def}$ is a second value being currently processed by the compression algorithm.

10. The method of claim 1, wherein each first value is a point in time.

11. The method of claim 1, wherein the user interface quality experience criteria comprises a target time limit for displaying the compressed data set after the request to display data from the input data set.

12. The method of claim 1, further comprising, prior to transmitting the compressed data set:

identifying a section of the compressed data set comprising a low amount of variation;

increasing the difference level for the section of the compressed data set;

reprocessing, using the compression algorithm, the section of the compressed data set using the increased difference level;

replacing the section of the compressed data set with entries from reprocessing the section to produce a modified compressed data set; and transmitting the modified compressed data set for display.

13. An apparatus comprising:

a processor; and a memory storing code, the code being executable by the processor to perform operations comprising:

identifying a maximum value and a minimum value in an input data set in response to a request to display data from the input data set, the input data set remote from a display location, the input data set comprising a plurality of entries, each entry comprising a first value and a second value, wherein the first values are ordered sequentially and the maximum value and the minimum value are second values;

calculating a difference between the minimum value and the maximum value, wherein the difference is a height;

determining a target data amount to be downloaded to a user display interface to satisfy user interface quality experience criteria;

calculating a difference level for a compression algorithm, wherein the difference level is used with the compression algorithm to select entries of the input data set to be stored in a compressed data set and is based on the input data set, the target data amount and the height;

processing the input data set with the compression algorithm and the difference level to create the compressed data set; and transmitting the compressed data set for display.

14. The apparatus of claim 13, wherein the compressed data set is for a default range of first values in the input data set and the operations further comprising, in response to a request to display data from a subset of the input data set:

identifying a maximum value and a minimum value of the subset;

calculating a difference between the minimum value and the maximum value of the subset, wherein the difference is a height of the subset;

calculating a difference level for the subset, wherein the difference level is used with the compression algorithm to select entries to be stored in a compressed subset and is based on the subset, the target data amount and the height of the subset;

processing the subset with the compression algorithm and the difference level of the subset to create the compressed subset; and transmitting the compressed subset for display.

15. The apparatus of claim 14, wherein the difference level for the subset is calculated as $\Delta_{zoom}=|\log_2(h_{sub})|*S_{sub}$, where:

$\Delta_{zoom}$ is the difference level for the subset;

$h_{sub}$ is the height of the subset; and $S_{sub}$ is a compression scalar of the subset and comprises a scalar derived from the target data amount and a total number of first values in the subset, and wherein the compression scalar of the subset comprises a compression scalar for the input data set multiplied by a ratio of a number of first values of the subset divided by a number of first values of the input data set.

16. The apparatus of claim 13, wherein the difference level for the subset is calculated as a compression scaler multiplied by a function of the height, wherein the compression scalar is for the input data set and comprises a scalar derived from the target data amount and a number of first values in the input data set.

17. The apparatus of claim 13, wherein:

the user interface quality experience criteria comprises a target time limit for displaying the compressed data set after the request to display data from the input data set;

the target data amount is based on the user interface quality experience criteria and a transmission rate;

the target data amount is adjusted based on the user interface quality experience criteria and a current transmission rate for transmitting data to the display location; and/or the compression algorithm finds a next entry to store in the compressed data set using:

$$|C_{def}-P_{def}|>\Delta_{def}$$

where:

$P_{def}$ is a most recent previously stored second value in the compressed data set;

$\Delta_{def}$ is the difference level for the input data set; and $C_{def}$ is a second value being currently processed by the compression algorithm.

18. A program product comprising a non-volatile computer readable storage medium storing program code, the program code being configured to be executable by a processor to perform operations comprising:

identifying a maximum value and a minimum value in an input data set in response to a request to display data from the input data set, the input data set remote from a display location, the input data set comprising a plurality of entries, each entry comprising a first value and a second value, wherein the first values are ordered sequentially and the maximum value and the minimum value are second values;

calculating a difference between the minimum value and the maximum value, wherein the difference is a height;

determining a target data amount to be downloaded to a user display interface to satisfy user interface quality experience criteria;

calculating a difference level for a compression algorithm, wherein the difference level is used with the compression algorithm to select entries of the input data set to be stored in a compressed data set and is based on the input data set, the target data amount and the height;

processing the input data set with the compression algorithm and the difference level to create the compressed data set; and transmitting the compressed data set for display.

19. The program product of claim 18, wherein the compressed data set is for a default range of first values in the input data set and the code further configured to perform operations comprising, in response to a request to display data from a subset of the input data set:

identifying a maximum value and a minimum value of the subset;

subtracting the minimum value from the maximum value of the subset to calculate a height for the subset;

calculating a difference level for the subset, wherein the difference level is used with the compression algorithm to select entries to be stored in a compressed subset and is based on the subset, the target data amount and the height of the subset;

processing the subset with the compression algorithm and the difference level of the subset to create the compressed subset; and transmitting the compressed subset for display.

20. The program product of claim 18, wherein:

the difference level for the input data set is calculated:

using a function of the height customized based on the target data amount and a number of first values in the input data set; or using a compression scaler multiplied by a function of the height, wherein the compression scalar is for the input data set and comprises a scalar derived from the target data amount and a number of first values in the input data set; and/or the compression algorithm finds a next entry to store in the compressed data set using:

$$|C_{def}-P_{def}|>\Delta_{def}$$

where:

$P_{def}$ is a most recent previously stored second value in the compressed data set;

$\Delta_{def}$ is the difference level for the input data set; and $C_{def}$ is a second value being currently processed by the compression algorithm.

* * * * *